(12) United States Patent
Kim et al.

(10) Patent No.: US 9,196,185 B2
(45) Date of Patent: Nov. 24, 2015

(54) TESTING APPARATUS FOR DISPLAY DEVICE

(71) Applicants: Samsung Display Co., Ltd., Yongin, Gyeonggi-Do (KR); Dae Sung Lee, Asan-si (KR); KODI-S CO., LTD., Seoul (KR)

(72) Inventors: Kyu Tae Kim, Asan-si (KR); Joong Young Ryu, Cheonan-si (KR); Chang Hyun Ryu, Cheonan-si (KR)

(73) Assignees: SAMSUNG DISPLAY CO., LTD. (KR); Dae Sung Lee (KR); KODI-S CO., LTD. (KR)

( * ) Notice: Subject to any disclaimer, the term of this patent is extended or adjusted under 35 U.S.C. 154(b) by 194 days.

(21) Appl. No.: 13/842,230

(22) Filed: Mar. 15, 2013

(65) Prior Publication Data

US 2014/0062499 A1 Mar. 6, 2014

(30) Foreign Application Priority Data

Aug. 29, 2012 (KR) .......................... 10-2012-0095013

(51) Int. Cl.
*G01R 1/067* (2006.01)
*G09G 3/00* (2006.01)
*G09G 3/20* (2006.01)

(52) U.S. Cl.
CPC ............... *G09G 3/006* (2013.01); *G01R 1/067* (2013.01); *G09G 3/20* (2013.01); *Y10T 156/10* (2015.01)

(58) Field of Classification Search
CPC .......... G09G 3/006; G09G 3/3648; G09G 2300/0426; G09G 3/3677; G09G 2300/0408; G09G 2300/0421; G09G 3/18; G09G 3/3275; G02F 1/13452; G02F 1/13458; G02F 1/13454; H01L 24/11–24/90; G01R 1/067
See application file for complete search history.

(56) References Cited

U.S. PATENT DOCUMENTS

| | | | |
|---|---|---|---|
| 6,628,364 B2 * | 9/2003 | Yeo et al. | 349/151 |
| 6,798,232 B2 * | 9/2004 | Lim | 324/760.01 |
| 6,924,875 B2 * | 8/2005 | Tomita | 349/192 |
| 7,133,039 B2 * | 11/2006 | Moon et al. | 345/211 |
| 7,579,848 B2 | 8/2009 | Bottoms et al. | |
| 2001/0040451 A1 | 11/2001 | Yoshida et al. | |
| 2008/0284760 A1 * | 11/2008 | Brunner | 345/204 |

FOREIGN PATENT DOCUMENTS

| | | |
|---|---|---|
| JP | 2009-103475 | 5/2009 |
| JP | 2011-133389 | 7/2011 |
| KR | 10-0340943 | 6/2002 |
| KR | 10-0458562 | 11/2004 |
| KR | 10-2006-0089968 | 8/2006 |
| KR | 10-0720378 | 5/2007 |
| KR | 10-1000418 | 12/2010 |
| KR | 10-2012-0015770 | 2/2012 |

* cited by examiner

*Primary Examiner* — Vinh Nguyen
(74) *Attorney, Agent, or Firm* — Innovation Counsel LLP

(57) ABSTRACT

A testing apparatus for a display device according to an embodiment of the present invention includes: a substrate; a driving chip mounted on the substrate; and a pad disposed on the substrate and electrically connected to the driving chip, wherein the pad includes a bottom layer electrically connected to the driving chip, and a sheet layer disposed on the bottom layer and electrically connected to the bottom layer, and wherein a lateral surface of the bottom layer is not covered by the sheet layer.

10 Claims, 12 Drawing Sheets

TESTING APPARATUS FOR DISPLAY DEVICE

RELATED APPLICATIONS

This application claims priority to and the benefit of Korean Patent Application No. 10-2012-0095013 filed in the Korean Intellectual Property Office on Aug. 29, 2012, the entire contents of which are incorporated herein by reference.

BACKGROUND OF THE INVENTION (a) Field of the Invention

Embodiments of the present invention relate to a testing apparatus for a display device and manufacturing method thereof.

(b) Description of the Related Art

A display device, for example, a flat panel display includes a display panel displaying images and a driving unit for driving pixels of the display panel. A driving unit may be implemented, for example, as a semiconductor chip, which is attached to a display panel after manufacturing of the display panel is completed. The display panel may be tested to find defects of the display panel by using a testing device before the driving unit is attached to the display panel.

A testing device may include, for example, a semiconductor chip for driving pixels of a display panel and a circuit board mounting the semiconductor chip. The testing circuit board may include a plurality of testing pads connected to the testing semiconductor chip. When testing the display panel, the testing pads are in contact with pads of the display panel, and then the pixels of the display panel are driven to be tested to find defects of the display panel.

It may be required that the testing device has excellent electrical characteristics since it sends electrical signals to drive the pixels, and, in addition, that the testing device has excellent durability and wear resistance since it contacts display panels repeatedly.

SUMMARY OF THE INVENTION

A testing apparatus for a display device according to an embodiment of the present invention includes: a substrate; a driving chip mounted on the substrate; and a pad disposed on the substrate and electrically connected to the driving chip, wherein the pad includes: a bottom layer electrically connected to the driving chip; and a sheet layer disposed on the bottom layer and electrically connected to the bottom layer, and wherein a lateral surface of the bottom layer is not covered by the sheet layer to be exposed.

A conductive adhesion layer may be disposed between the bottom layer and the sheet layer.

The testing apparatus may further include a first plating layer that is disposed on the bottom layer and covers top and lateral surfaces of the bottom layer.

The testing apparatus may further include a second plating layer that covers a top surface of the sheet layer and lateral surfaces of the bottom layer The sheet layer may include at least one of a Be—Cu alloy, a Be—Ni alloy, and palladium (Pd), the bottom layer comprises copper (Cu), the first plating layer comprises tin (Sn), and the second plating layer comprises gold (Ag).

A method of manufacturing a testing apparatus for a display device according to an embodiment of the present invention includes: preparing a member including a first substrate and base pads that are disposed on the substrate; preparing a metal sheet work including branches having a substantially same structure and arrangement corresponding to the base pads; and attaching the metal sheet work on the base pad to form a sheet layer.

The method may further include attaching a driving chip on the first substrate.

The attaching the metal sheet work may include adhering the metal sheet work to the base pad with a conductive adhesion layer.

The base pad may include a bottom layer; and a first plating layer that covers top and lateral surfaces of the bottom layer.

The metal sheet work may include at least one of a Be—Cu alloy, a Be—Ni alloy, and palladium (Pd), the bottom layer may include copper (Cu), and the first plating layer may include tin (Sn).

The method may further include: forming a second plating layer on a top surface of the sheet layer and a lateral surface of the base pad by plating.

The second plating layer may include gold (Ag).

The method may further include forming a second plating layer on a top surface of the sheet layer and a lateral surface of the base pad by plating.

The preparing the metal sheet work may include: forming a metal sheet; and etching the metal sheet to form the metal sheet work.

The method may further include attaching the metal sheet on a second substrate before etching the metal sheet.

DETAILED DESCRIPTION OF THE EMBODIMENTS

Figure 1:
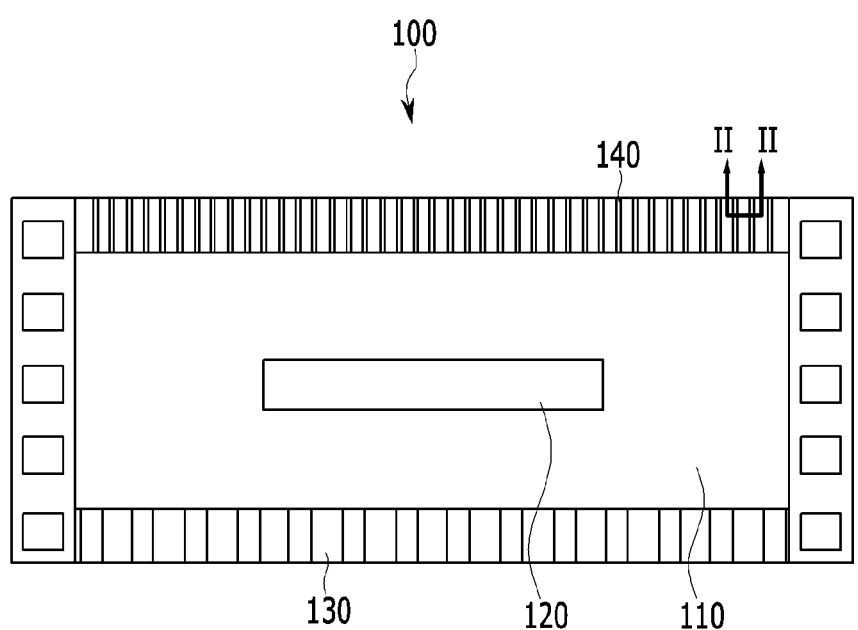
FIG. 1 is a schematic plan view of a testing apparatus for a display device according to an embodiment of the present invention.

Aspects of the embodiments will be described more fully hereinafter with reference to the accompanying drawings. As those skilled in the art would realize, the described embodiments may be modified in various different ways, all without departing from the spirit or scope. In the drawing, parts having no relationship with the explanation are omitted for clarity, and the same or similar reference numerals designate the same or similar elements throughout the specification.

A testing apparatus for a display device according to an embodiment of the present invention is described in detail with reference to FIG. 1 to FIG. 4.

Figure 2:
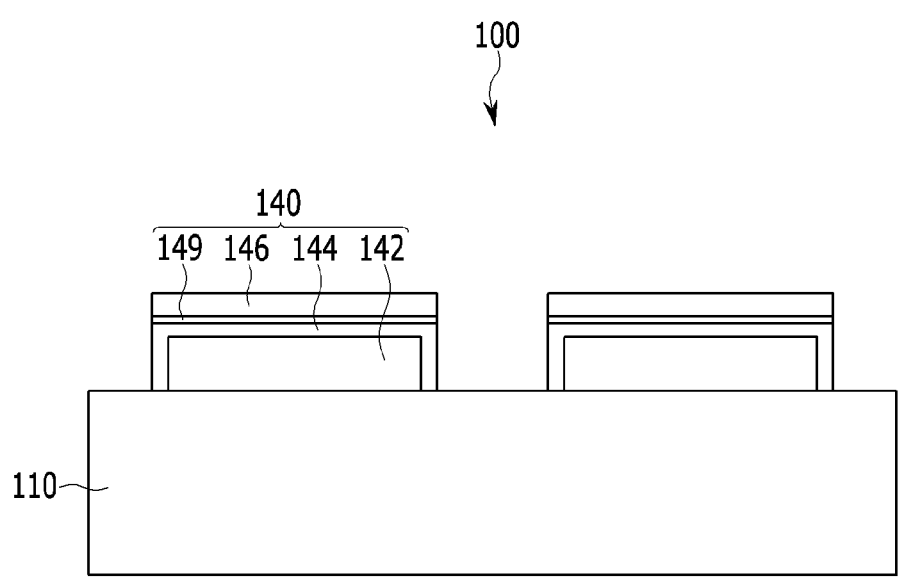
FIG. 2 to FIG. 4 are schematic sectional views of the testing apparatus shown in FIG. 1 taken along line II-II.
Figure 3:
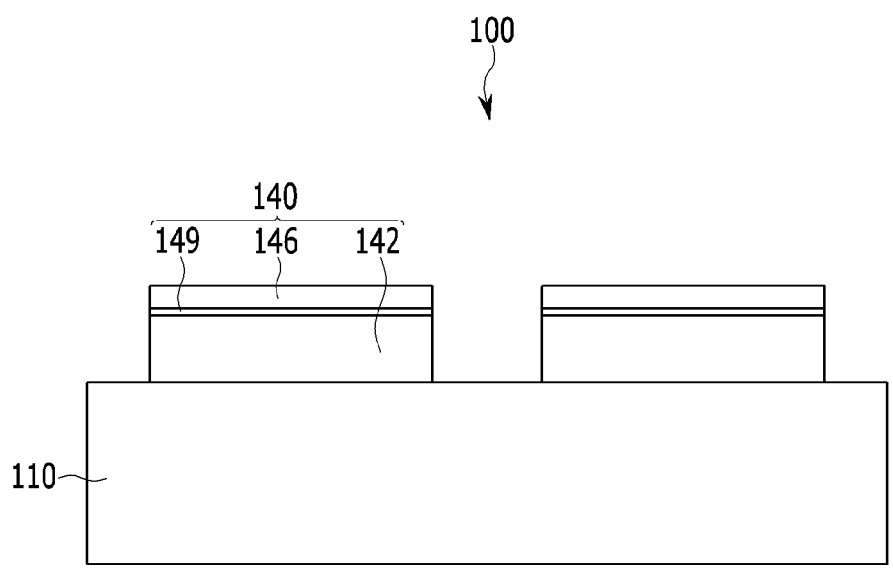
Figure 4:
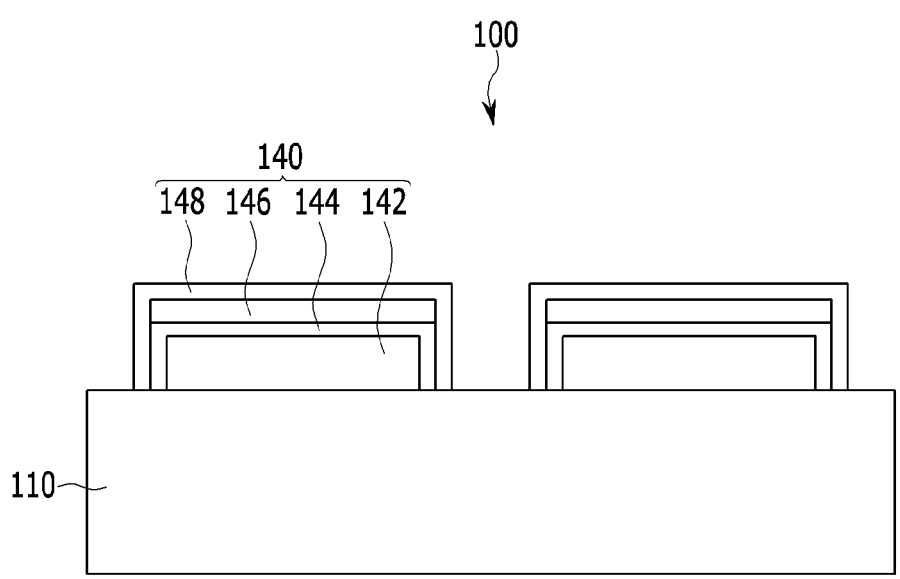

FIG. 1 is a schematic plan view of a testing apparatus for a display device according to an embodiment of the present invention, and FIG. 2 to FIG. 4 are schematic sectional views of the testing apparatus shown in FIG. 1 taken along line II-II.

Referring to FIG. 1, a testing apparatus for a display device 100 according to an embodiment of the present invention includes a substrate 110, a driver chip 120, a plurality of input pads 130, and a plurality of output pads 140.

The substrate 110 may be, for example, rectangular, and may include flexible material, for example, polyimide (PI). However, the shape and the material for the substrate 110 may not limited thereto.

The driver chip 120 may be mounted near a center of the substrate 110, and may drive pixels of a flat panel display, for example, a liquid crystal display or an organic light emitting display. The driver chip 120 may include a data driver that generates data signals to be applied to sources/drains of switching transistors in the pixels, or may include a gate driver that generates gate signals to be applied to gates of the switching transistors.

The plurality of input pads 130 may be disposed near an edge, for example, a long edge of the substrate 110, and may be arranged in a row. The input pads 130 may be electrically connected to the driver chip 120 through conductive lines (not shown) in the inside of the substrate 110, and may transmit input signals from an external device to the driver chip 120.

The plurality of output pads 140 may be disposed near another edge of the substrate 110 opposing the edge near the input pads 130, and may be arranged in a row. The output pads 140 may be electrically connected to the driver chip 120 through conductive lines (not shown) in the inside of the substrate 110, and may transmit signals from the driver chip 120 to an external device.

Referring to FIG. 2 to FIG. 4, at least one of the output pads 140 includes a plurality of layers deposited in sequence.

Referring to FIG. 2, an output pad 140 according to an embodiment of the present invention includes a bottom layer 142, a plating layer 144, and a sheet layer 146. The output pad 140 may have a width of about 15 μm to about 120 μm, and a thickness of about 20 μm to about 120 μm.

The bottom layer 142 may include a material having high conductivity, for example, copper (Cu), a Ni—Co alloy, or tin (Sn). A thickness of the bottom layer 142 may be about 5 μm to about 20 μm.

The plating layer 144 covers top and lateral surfaces of the bottom layer 142, and may be formed by plating a conductor on the surfaces of the bottom layer 142. The plating layer 144 may reduce electromagnetic interference between the output pads 140, and may include tin (Sn) or gold (Au). The thickness of the plating layer 144 may be about 3 μm to about 10 μm.

The sheet layer 146 is disposed on a top surface of the plating layer 144. The sheet layer 146 is adhered to the plating layer 144 with a conductive adhesion layer 149, and is electrically connected to the plating layer 144. Therefore, the lateral surfaces of the plating layer 144 may not be covered by the sheet layer 146 to be exposed. The sheet layer 146 may be fabricated from a metal sheet, and may have a substantially uniform thickness although the degree of uniformity may vary depending on the degree of precision of fabrication.

Since most conductors and metals may be formed in a form of a sheet and a thickness of the sheet may be adjusted in ease, it is easy to select materials for the sheet layer 146 and to adjust thickness of the sheet layer 146 in the present embodiment. For example, when the sheet layer 146 is formed of a material having high wear resistance such that the sheet layer 146 is sufficiently thick, a sufficient lifetime may be ensured although the sheet layer 146 is worn to some degree due to repetitive contact with pads of a display panel.

When the thickness of the output pad 140 is increased by using a method such as plating instead of using the sheet layer 146, a lateral thickness or a width of the output pad 140 may be also increased too, thereby securing a sufficient distance between the output pads 140 may not be possible. However, such a problem may be solved by using the present embodiment.

Examples of cheap materials having good characteristics for the sheet layer 146 include a Be—Cu alloy, a Be—Ni alloy, and palladium (Pd). The thickness of the sheet layer 146 may be about 10 μm to about 100 μm.

The conductive adhesion layer 149 may include an anisotropic conductive film (ACF), and may be omitted when the plating layer 144 and the sheet layer 146 is adhered in a direct manner without the adhesion layer 149.

Referring to FIG. 3, an output pad 140 according to another embodiment may not include the plating layer 144.

Referring to FIG. 4, an output pad 140 according to another embodiment may further include another plating layer 148 that covers the top and lateral surfaces of the sheet layer 146 and covers the lateral surfaces of the plating layer 144. The plating layer 148 may include a material having a low electrical resistance, for example, gold (Ag). FIG. 4 shows the plating layer 144 and no conductive adhesion layer 149. However, the plating layer 144 may be omitted and the conductive adhesion layer 148 may be used too.

The testing apparatus 100 shown in FIG. 1 to FIG. 4 may be permanently fixed to a display panel (not shown) so that the testing apparatus 100 may serve as a driving unit for a display device, for example, a data driver or a gate driver.

Now, a method of manufacturing the testing apparatus for a display device shown in FIG. 1 and FIG. 2 according to an embodiment of the present invention is described in detail with reference to FIG. 5 to FIG. 8.

Figure 5:
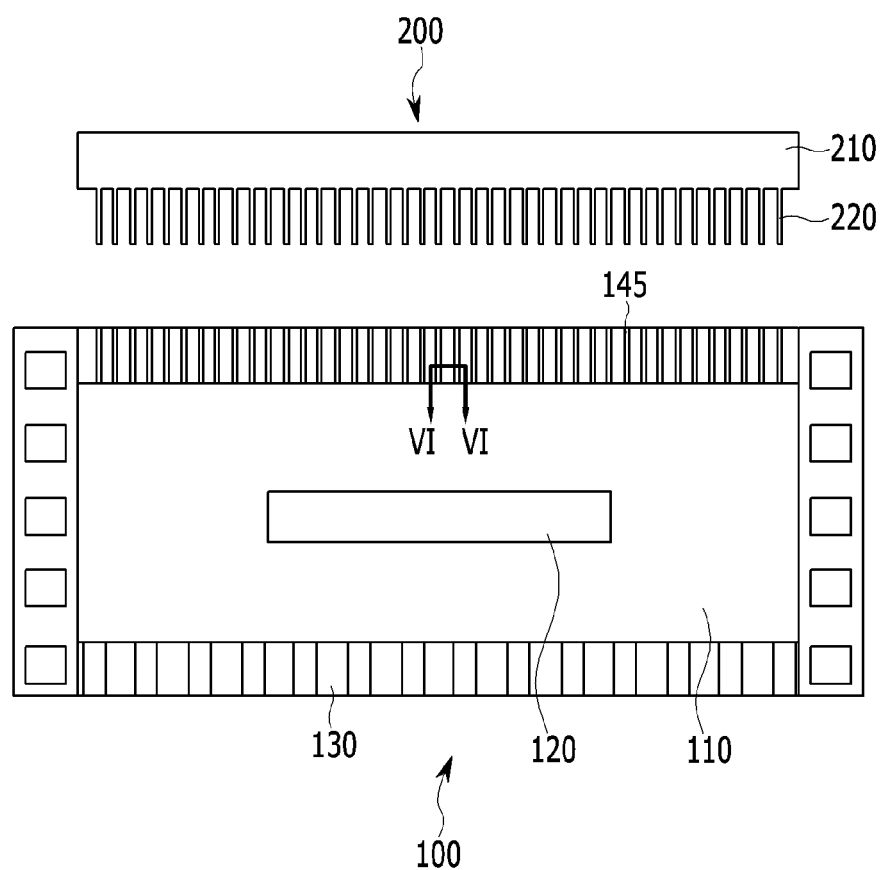
FIG. 5, FIG. 7 and FIG. 8 are schematic plan views sequentially illustrating a method of manufacturing the testing apparatus for a display device shown in FIG. 1 and FIG. 2 according to an embodiment of the present invention.
Figure 6:
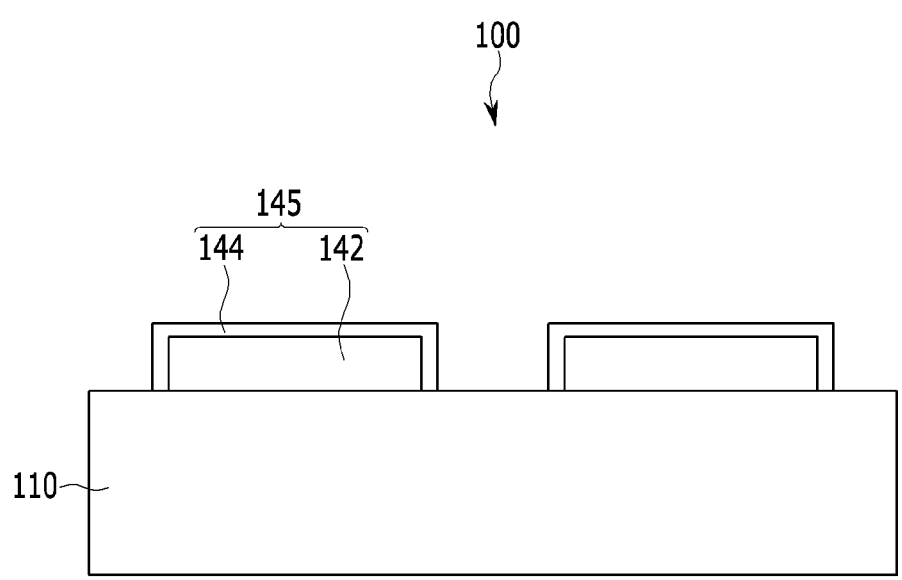
FIG. 6 is a schematic sectional view of the testing apparatus shown in FIG. 5 taken along line VI-VI.
Figure 7:
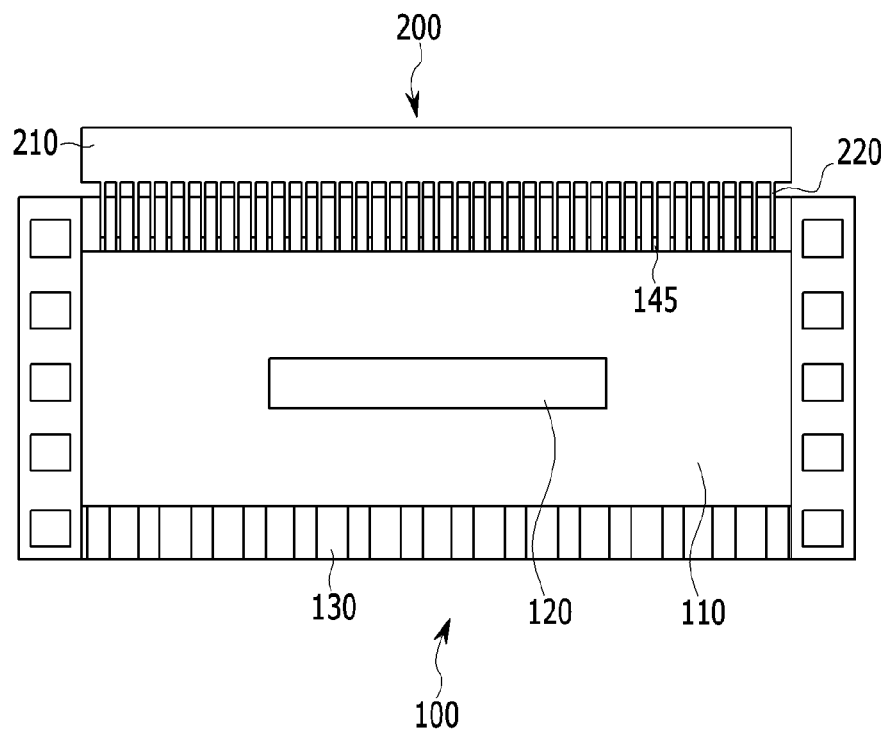
Figure 8:
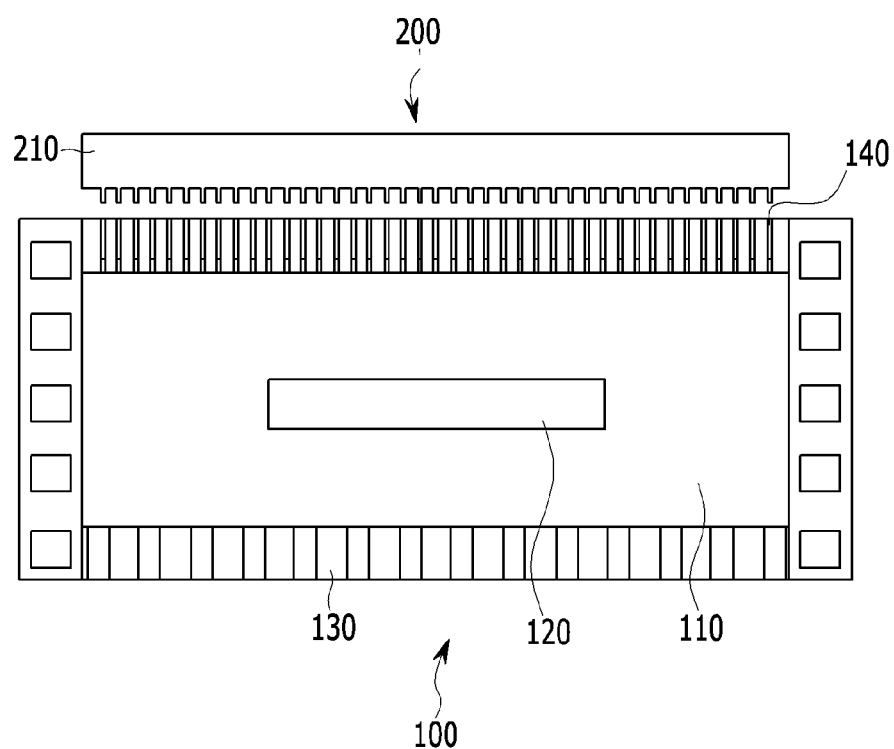

FIG. 5, FIG. 7 and FIG. 8 are schematic plan views sequentially illustrating a method of manufacturing the testing apparatus for a display device shown in FIG. 1 and FIG. 2 according to an embodiment of the present invention, and FIG. 6 is a schematic sectional view of the testing apparatus shown in FIG. 5 taken along line VI-VI.

Referring to FIG. 5 and FIG. 6, a testing apparatus 100 for a display device including a substrate 110, a driver chip 120, a plurality of input pads 130, and a plurality of base output pads 145 are prepared. Each of the base output pads 145 includes a bottom layer 142 and a plating layer 144 but not includes a sheet layer 146 and an adhesion layer 149 of the output pad 140 in the testing apparatus 100 shown in FIG. 1. The plating layer 144 may be omitted. The testing apparatus 100 shown in FIG. 5 may also be permanently adhered to a display panel to serve as a data driver or a gate driver.

In addition, a sheet work 200 including a stem 210 and a plurality of branches 220 are prepared. The sheet work 200 may be manufactured from a metal sheet. The branches 220 has a structure and an arrangement corresponding to the base output pads 145 of the testing apparatus 100, and the stem 210 are connected to the branches 220.

Referring to FIG. 7, after aligning the branches 220 of the sheet work 200 with the base output pads 145 of the testing apparatus 100, the branches 220 are adhered to the base output pads 145 using a conductive adhesion layer (149 in FIG. 2).

The conductive adhesion layer 149 may be formed on the sheet work 200 when the sheet work 200 is formed. In this case, the sheet work 200 having the conductive adhesion layer 149 may be attached to the output pads 145 directly without using an additional adhesion layer.

Referring to FIG. 8, the branches 220 of the sheet work 200 are cut to be fitted to the testing apparatus 100, thereby completing the testing apparatus 100.

The driver chip 120 may be attached on the substrate 110 after the sheet layer 146 is adhered to the substrate 110.

Another plating layer 148 may be formed on the testing apparatus 100 after the branches 220 are adhered to the testing apparatus 100 or the branches 220 are cut to be fitted to the testing apparatus 100.

As described above, the sheet work 200 shown in FIG. 5 is manufactured from a metal sheet, which is described in detail with reference to FIG. 9 and FIG. 10.

Figure 9:
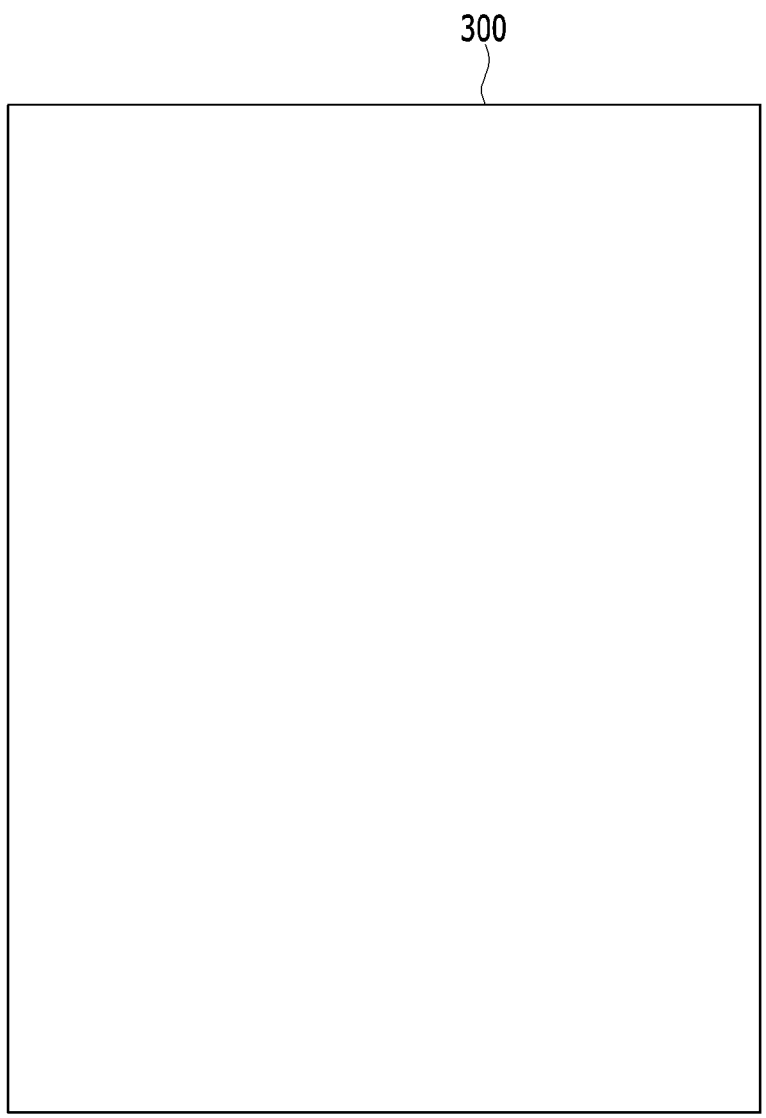
FIG. 9 and FIG. 10 are schematic plan views illustrating an example of manufacturing a sheet work used in a method of manufacturing a testing apparatus for a display device.
Figure 10:
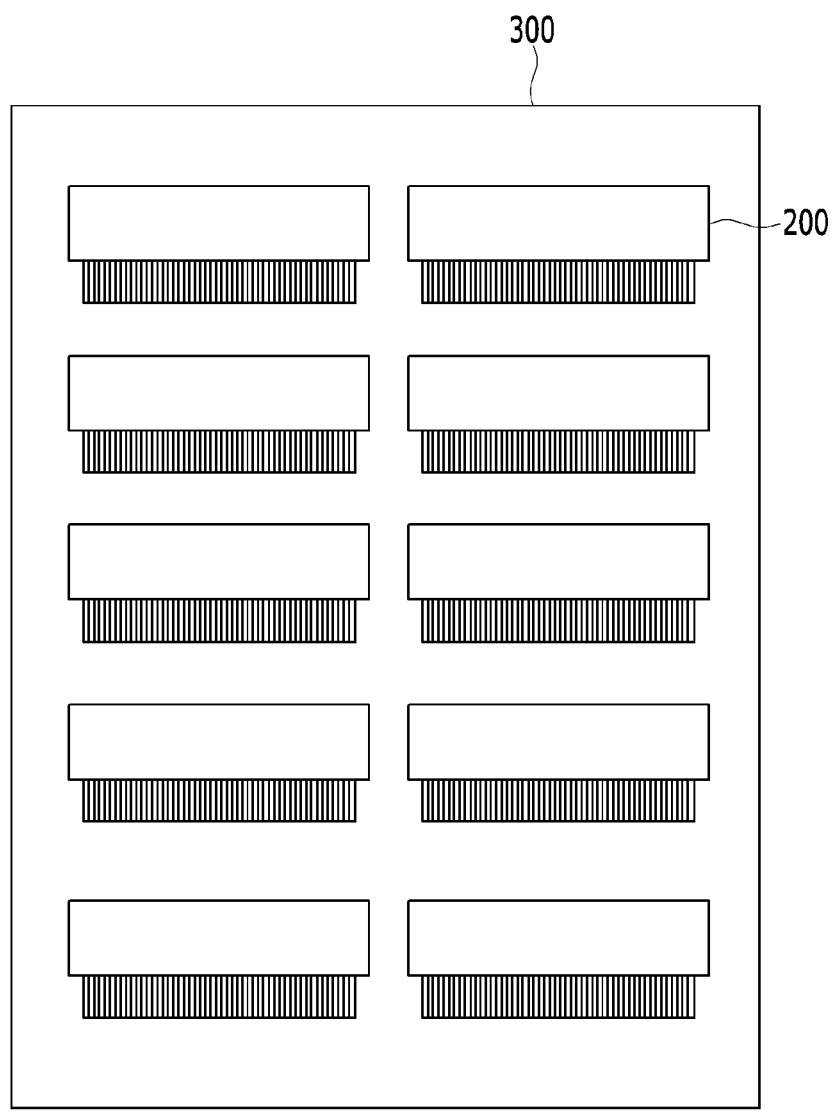

FIG. 9 and FIG. 10 are schematic plan views illustrating an example of manufacturing a sheet work 200 used in a method of manufacturing a testing apparatus for a display device.

Referring to FIG. 9, first, a metal sheet 300 may be formed by rolling, for example. For example, a metal roll having a desired thickness may be formed by rolling (not shown), and the metal roll may be cut into the metal sheet 300.

The conductive adhesion layer 149 may be formed on the metal sheet 300. The conductive adhesion layer 149 may have properties such as low melting point and high adhesive strength to the metal sheet 300, the plating layer 144 and the bottom layer 142. A solder paste, such as eutectic Sn—Pb (63% tin and 37% lead), SAC alloys (tin/silver/copper) and Sn/Sb alloy may be used as the conductive layer 149.

Referring to FIG. 10, the metal sheet 300 is etched to form a plurality of metal sheet works 200. The etching of the metal sheet 300 may be performed by using lithography, for example.

Now, a method of testing a display panel using a testing apparatus for a display device according to an embodiment of the present invention is described in detail with reference to FIG. 11 and FIG. 12.

Figure 11:
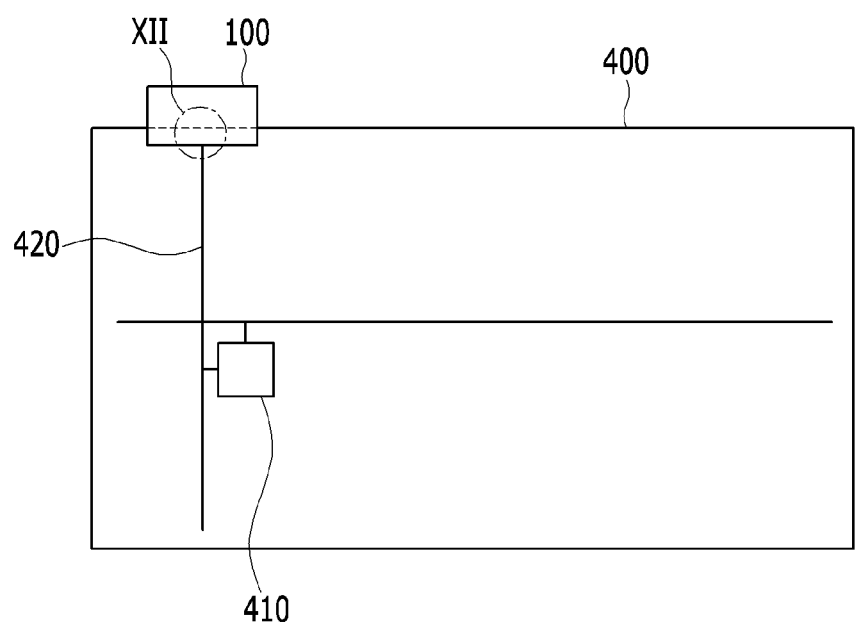
FIG. 11 is a schematic plan view showing a testing apparatus for a display device according to an embodiment of the present invention in contact with a display panel.
Figure 12:
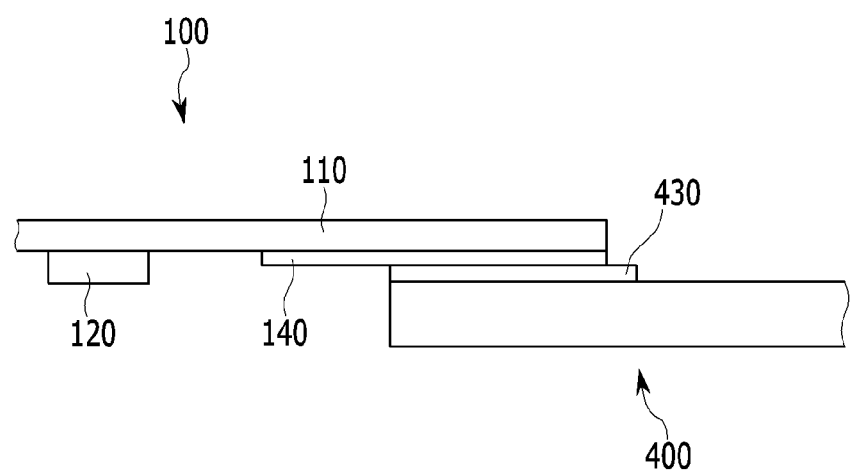
FIG. 12 is a sectional view of a portion XII shown in FIG. 11.

FIG. 11 is a schematic plan view showing a testing apparatus for a display device according to an embodiment of the present invention in contact with a display panel, and FIG. 12 is a sectional view of a portion XII shown in FIG. 11.

Referring to FIG. 11 and FIG. 12, a testing apparatus 100 for a display device according to an embodiment of the present invention is aligned with a display panel 400 including pixels 410 and signal lines 420 so that the output pads 140 of the testing apparatus 100 may be in contact with pads 430 disposed at an ends of the signal lines 420 in the display panel 400. Next, signals are inputted into the display panel through input pads (130 in FIG. 1) of the testing apparatus 100, and then, operations of the pixels 410 in the display panel 400 are tested. For example, when control signals for controlling the driver chip 120 and data signals are applied to the input pads 130, the driver chip 120 may generate signals to be applied to the pixels 410 of the display panel 400 and may output the generated signals through the output pads 140.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A testing apparatus for a display device, the testing apparatus comprising:
   a substrate;
   a driving chip mounted on the substrate; and
   an input pad and an output pad disposed on the substrate and electrically connected to the driving chip, the input pad being configured to transmit input signals from an external device, and the output pad being configured to contact a pad disposed at an end of the signal line in the display device and transmit signals from the driver chip to the display device,
   wherein the output pad comprises:
   a bottom layer electrically connected to the driving chip; and
   a sheet layer disposed on the bottom layer and electrically connected to the bottom layer, and
   wherein a lateral surface of the bottom layer is not covered by the sheet layer, and
   wherein the sheet layer does not extend outside of the bottom layer.

2. The testing apparatus of claim 1, further comprising a conductive adhesion layer disposed between the bottom layer and the sheet layer.

3. The testing apparatus of claim 2, further comprising a first plating layer that is disposed on the bottom layer and covers top and lateral surfaces of the bottom layer.

4. The testing apparatus of claim 3, further comprising a second plating layer that covers a top surface of the sheet layer and lateral surfaces of the bottom layer.

5. The testing apparatus of claim 4, wherein the sheet layer comprises at least one of a Be—Cu alloy, a Be—Ni alloy, and palladium (Pd), the bottom layer comprises copper (Cu), the first plating layer comprises tin (Sn), and the second plating layer comprises gold (Ag).

6. The testing apparatus of claim 2, further comprising a plating layer that covers a top surface of the sheet layer and lateral surfaces of the bottom layer.

7. The testing apparatus of claim 1, further comprising a first plating layer that is disposed on the bottom layer and covers top and lateral surfaces of the bottom layer.

8. The testing apparatus of claim 7, further comprising a second plating layer that covers a top surface of the sheet layer and lateral surfaces of the bottom layer.

9. The testing apparatus of claim 8, wherein the sheet layer comprises at least one of a Be—Cu alloy, a Be—Ni alloy, and palladium (Pd), the bottom layer comprises copper (Cu), and the first plating layer comprises tin (Sn), and the second plating layer comprises gold (Ag).

10. The testing apparatus of claim 1, further comprising a plating layer that covers a top surface of the sheet layer and lateral surfaces of the bottom layer.

* * * * *